(12) United States Patent
Yama

(10) Patent No.: US 6,377,109 B1
(45) Date of Patent: Apr. 23, 2002

(54) LOAD DRIVER CIRCUIT

(75) Inventor: Michiaki Yama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/627,626

(22) Filed: Jul. 28, 2000

(30) Foreign Application Priority Data

Jul. 30, 1999 (JP) ............................................. 11-216725

(51) Int. Cl.$^7$ .............................................. H03K 17/56
(52) U.S. Cl. ....................... 327/423; 327/108; 327/110; 327/424; 327/588; 318/667
(58) Field of Search .................. 327/109, 110, 327/112, 108, 423, 424, 588, 111; 318/667, 123, 768, 138, 254, 245

(56) References Cited

U.S. PATENT DOCUMENTS

| | | | | |
|---|---|---|---|---|
| 5,569,991 A | * | 10/1996 | Matsuoka et al. | 318/286 |
| 5,763,963 A | * | 6/1998 | Zydek et al. | 327/110 |
| 5,872,441 A | * | 2/1999 | McCann | 318/701 |
| 6,014,149 A | * | 8/2000 | Pelly | 318/254 |
| 6,017,844 A | * | 8/2000 | Berg et al. | 327/110 |

* cited by examiner

Primary Examiner—Terry D. Cunningham
Assistant Examiner—Long Nguyen
(74) Attorney, Agent, or Firm—Hogan & Hartson, LLP

(57) ABSTRACT

The invention provides a load driver circuit including at least one FET such as MOSFET QX, QY, and QZ, controlled by a control circuit providing gate control voltage to the load driving FET by means of a feedback loop connecting the FET and the control circuit, without utilizing any resistor connected in series with the load to detect the load current. This is done by detecting, as a measure of the load current Io, the drain-source voltage drop of the load driving FET QX–QZ by means of detection means 13, 14, and 15. Because the control circuit utilizes no resistor, but utilizes a MOSFET instead, in detecting load current Io, the invention advantageously has a compact form, requiring only a minimum space for connection with external components, cuts down significant power loss that would be otherwise entailed by a current detection resistor, is capable of detecting the load current at high precision, thereby allowing precise control of the load current, and provides an improved wide output dynamic range.

8 Claims, 6 Drawing Sheets

LOAD DRIVER CIRCUIT

FIELD OF THE INVENTION

The invention relates to a driver circuit for controlling a high power load such as a actuator driver for CD or CD-ROM and a power amplifier for audio systems, and more particularly, to a current detector for use in such load driver circuits.

BACKGROUND OF THE INVENTION

Metal oxide semiconductor field effect transistors (MOSFETs) are widely used as output stage elements and control elements of driver circuits controlling high power loads such as a actuator driver for CD or CD-ROM and a power amplifier for audio systems. These MOSFETs are mostly controlled by controlling their gate voltages.

FIGS. 1 and 2 show typical load driver circuits having a single bridge structure (FIG. 1) and a three-phase bridge structure (FIG. 2).

Load driving MOSFETs Q1–Q4 of the load driver circuit shown in FIG. 1 are controlled for conduction thereof by respective gate control signals 52 sent from a control circuit 51. Normally, the load driving MOSFETs Q1 and Q4 are simultaneously turned ON in pairs to provide a load current Io in one direction or another in the bridge. So are the load driving MOSFETS Q2 and Q3. The load current Io passing through a resistor for determining the current through a load L (referred to as current detection resistor Rs) generates a voltage drop across the resistor Rs, which is equal to the product Io*Rs. This voltage drop is amplified A times, say, by an amplifier 53, which generates a detection voltage Vo.

The detection voltage Vo is fed back to the control circuit 51 along with a reference voltage Vi. The control circuits supplies gate control signals 52 to the load driving MOSFETs Q1–Q4. The gate control signals 52 can be voltage control signals or pulse control signals such as pulse width modulation (PWM) control signals. Through the feedback loop the load current Io through the load L is adjusted to a constant level associated with the reference voltage Vi until the detection voltage Vo matches the reference voltage Vi.

The load driver circuit of FIG. 2 includes three loads LU, LV, and LW operable in three different phases and six load driving MOSFETs QU, QV, QW, QX, QY, and QZ forming an associated three-phase bridge for switching the three loads. Coupled to the three phase bridge is a control circuit 61 generating suitable three-phase gate control signals 62 for the three-phase bridge. An amplifier 63 is similar to the amplifier 53 of FIG. 1, and has a given amplification factor of A, for example. Since the load driver circuit of FIG. 2 operates in the same manner as the one shown in FIG. 1, further details of the circuit will be omitted.

It is noted that in such conventional load driver circuits as described above, the current detection resistor Rs is connected to a power source or the ground in series with the load in order to detect the load current through the load L or one of LU, LV, and LW. The load current Io is normally in the range from the order of 100 mA to the order of 1 A, and the resistance of the current detection resistor Rs for generating a measurable detection voltage is in the range from the order of 0.1 ohms to the order of 1 ohm.

Therefore, the power consumed by the current detection resistor Rs itself is disadvantageously large. That is, it is not negligible as compared with the entire power consumption. In addition, since such nominally large load current Io passes the detection resistor Rs, the resistor must be fairly large in dimension, requiring an extra large space for connection thereof with the driver circuit on a semiconductor chip.

Another drawback pertinent to such current detection resistor is that since the current detection resistor Rs is inserted in series with the load, the output dynamic range of the load is limited by the current detection resistor Rs.

SUMMARY OF THE INVENTION

It is therefore an object of the invention to provide a load driver circuit including at least one FET such as MOSFET for driving a load, said MOSFET controlled by a control circuit providing gate control voltage to the load driving FET by means of a feedback loop connecting the FET and the control circuit, without utilizing any resistor (referred to as detection resistor) connected in series with the load to detect the load current. Because the invention utilizes a MOSFET instead of a resistor in detecting the load current, the control circuit:

(a) has a compact form, requiring only a minimum space for connection with external components;

(b) cuts down significant power loss that would be otherwise entailed by a current detection resistor;

(c) is capable of detecting the load current at high precision, thereby allowing precise control of the load current; and (d) provides an improved output dynamic range.

In accordance with one embodiment of the invention, a load driver circuit comprises:

at least one load driving MOSFET;

means for detecting the level of a load current including:
a detection transistor;
a detection resistor connected in series with said detection transistor for detecting a voltage drop across said detection resistor; and
a difference amplifier for controlling said detection transistor, said difference amplifier fed at one input end thereof with a voltage drop across the drain and the source of said load driving MOSFET in conduction, and at the other input end thereof with said voltage drop across said detection resistor; and
control means for receiving a signal associated with said voltage drop across the drain and the source of said load driving MOSFET along with a reference value indicative of a target level for said signal, and generating gate control signal to said load driving MOSFET to thereby equilibrate said level of said signal with said reference value.

In actuality, the control means described above may receive a reference voltage to compare with the voltage drop across the drain and the source of the load driving MOSFET, or a reference current with which the load current Io as calculated from the detected voltage drop across the drain and the source of the load driving MOSFET is compared.

The inventive load driver circuit makes it unnecessary to use a current detection resistor in the driver circuit by detecting the voltage drop across the drain and the source of the load driving MOSFET. This is based on the fact that an excellent linear relationship exists between the current passing through the MOSFET and the voltage drop across the drain and the source of the load driving MOSFET over a certain range of voltage, so that the effective resistance is constant/invariable, which enables accurate detection of the voltage drop across the load.

It should be appreciated that no current detection resistor is required in the invention, so that power consumption due to such current detection resistor as is used in conventional load driver circuit is zero. In addition, no mounting space for a terminal for connection with such resistor is required on the semiconductor chip.

The elimination of a current detection resistor to be connected in series with the load and a load driving MOSFET as in conventional driver circuits widens the working range of voltage of the load, and hence the dynamic range of the driver circuit.

The means for detecting the level of a load current includes a detection transistor, a detection resistor, and a difference amplifier such that the current through the detection resistor (referred to as detection current) is far smaller than the load current, yet it is precisely proportional to the load current. Consequently, power consumption by the detection resistor can be made very small. Further, since the detection resistor can be fabricated on the same semiconductor chip as the load driving MOSFET, they can have the same temperature dependent characteristics.

In cases where the control circuit includes a multiplicity of load driving MOSFETs forming a multi-phase bridge configuration, they can be selectively turned on at different times or phases by a switching means to provide their voltage drops across the drain and the source to the difference amplifier in the respective phases. Thus, the bridge configuration may practically serve as single detection bridge.

In accordance with another embodiment of the invention, a load driving circuit comprises:
  at least one load driving MOSFET;
  means for detecting the level of a load current including:
    a detection transistor;
    a detection MOSFET serving as a detection resistor connected in series with said detection transistor for detecting a voltage drop across said detection MOSFET; and
    a difference amplifier for controlling said detection transistor, said difference amplifier fed at one input end thereof with a voltage drop across the drain and the source of said load driving MOSFET in conduction, and at the other input end thereof with said voltage drop across said detection MOSFET; and
  control means for receiving a signal associated with said voltage drop across the drain and the source of said load driving MOSFET along with a reference value indicative of a target level for said signal, and generating a gate control signal to said load driving MOSFET to thereby equilibrate said level of said signal with said reference value.

As in the preceding example, the control means described above may receive a reference voltage to compare with the voltage drop across the drain and the source of the load driving MOSFET, or a reference current with which the load current Io as calculated from the detected voltage drop across the drain and the source of the load driving MOSFET is compared.

In this arrangement, the means for detecting the level of a load current includes a detection transistor, a detection MOSFET, and a difference amplifier such that the current through the detection MOSFET (referred to as detection current) is far smaller than the load current, yet it is precisely proportional to the load current. Consequently, power consumption by the detection MOSFET can be made very small. Further, since the detection MOSFET is fabricated on the same semiconductor chip as the load driving MOSFET, they will have the same temperature dependent characteristics or qualitative fluctuations induced during the manufacturing process. Therefore, their resistances will not be influenced by such fluctuations, so that the detection voltage will be precisely proportional to the load current.

In this instance also, if the control circuit includes a multiplicity of load driving MOSFETs forming a bride configuration, they can be selectively turned on at different times or phases by a switching means to provide their voltage drops across the drain and the source to the difference amplifier in the respective phases. Thus, the bridge configuration may practically serve as single detection means.

In accordance with a further embodiment of the invention, a load driving circuit comprises:
  at least one load driving MOSFET;
  a detection MOSFET serving as a detector resistor;
  means for detecting the level of a load current, wherein said detecting means is operable to:
    sense a voltage drop across the drain and the source of said load driving MOSFET;
    sense a voltage drop across the drain and the source of said detection MOSFET; and
    control a current passing through the detection MOSFET so that said voltage drop across the drain and the source of said detection MOSFET equals said voltage drop across the drain and the source of said load driving MOSFET; and
  control means for receiving a signal associated with said voltage drop across the drain and the source of said load driving MOSFET along with a reference value indicative of a target level for said signal, and generating a gate control signal to said load driving MOSFET to thereby equilibrate said level of said signal with said reference value.

As in the preceding examples, the control means described above may receive a reference voltage to compare with the voltage drop across the drain and the source of the load driving MOSFET, or a reference current with which the load current Io as calculated from the detected voltage is compared.

BRIEF DESCRIPTION OF THE DRAWINGS

The invention will now be described in detail by way of example with reference to accompanying drawings, in which like reference numerals indicate like components and in which.

DETAILED DESCRIPTION OF THE PREFERRED EMBODIMENT

Figure 3:
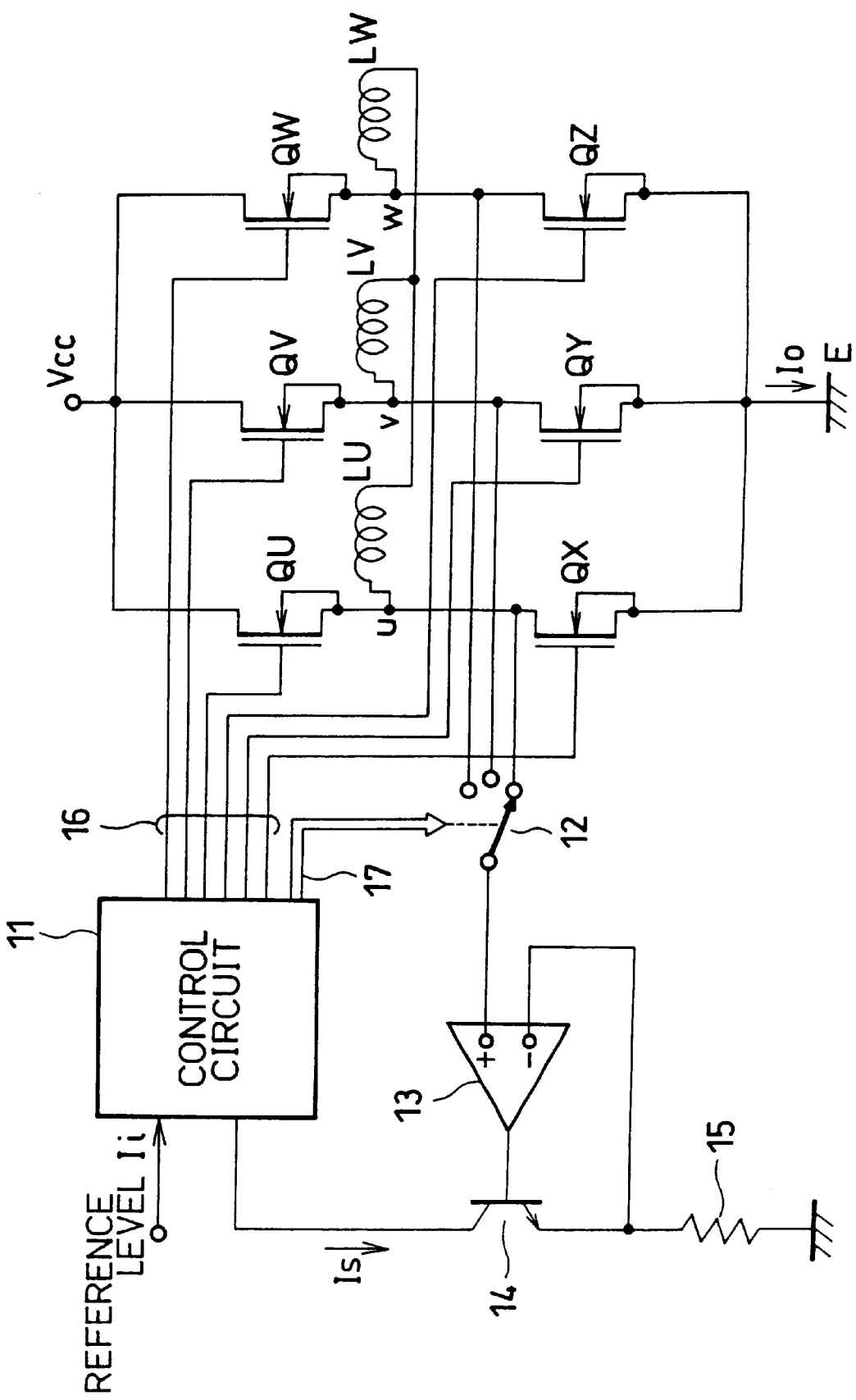
FIG. 3 shows a first load driver circuit having a three-phase bridge configuration according to the invention.

Referring now to FIG. 3, there is shown a first exemplary load driver circuit according to the invention. It is seen in the figure that MOSFETs QU–QW and QX–QZ are used as load driving FETs. This is also the case in all the examples described below.

As shown in FIG. 3, three pairs of series connected load driving MOSFETs QU and QX, QV and QY, and QW and QZ are connected in parallel with each other between a source voltage Vcc and the ground E. Connected to the nodes u, v, and w of the respective series connections of the paired MOSFETs are three loads LU, LV, and LW, respectively, as shown in FIG. 3. These loads are designed to operate mutually out-of-phase. In the example shown herein, all of the load driving MOSFETs are of N channel type.

Drain of the load driving MOSFETs QX, QY, and QZ are connected to the respective switching contact points of a selection switch 12, while the common terminal of the selection switch 12 is connected to the non-inverting "+" terminal of an operational amplifier 13 serving as a difference amplifier. The load driving MOSFET QU-QZ are provided at the gates thereof with gate control signals 16 supplied from a control circuit 11 to drive the three phase loads LU, LV, LW. At the same time, a signal 17 (hereinafter referred to as selection switch driving signal 17), synchronized to the gate control signals, is supplied to the switch 12 to select the load associated with the conducting MOSFET. Although the selection switch 12 is shown to be a mechanical one having contact points, it could be understood to those skilled in the art that it may be of any non-mechanical switch.

A detection transistor 14 is connected in series with a detection resistor 15 as shown in FIG. 3. The voltage at the node of the detection transistor 14 and the detection resistor 15 is supplied to the inverting "−" terminal of the operational amplifier 13, whose output is in turn supplied to the base of the detection transistor 14. The current Is (referred to as detection current) flowing through the series connected detection transistor 14 and the detection resistor 15 is fed to the control circuit 11 along with a reference or target level Ii with which the detection current Is is compared.

The gate control signals 16 are supplied from the control circuit 11 to the respective gates of the load driving MOSFETs QU–QW and QX–QZ so as to drive the three-phase loads LU, LV, and LW at a prescribed timing. For example, the gate control signals are fed to the load driving MOSFETs QU–QW and MOSFETs QX–QZ such that the MOSFETs QU–QW may be turned on in sequence each offset by 120 degrees in the first half cycle, and the MOSFETs QX–QZ may be turned on in sequence each offset by 120 degrees in the next half cycle.

Accordingly, only one of the load driving MOSFETs QX–QZ is conductive at a time. The selection switch drive signal 17 is issued from the control circuit 11 to the switch 12 so that the switch 12 will select the conducting MOSFET QX–QZ. Consequently, a voltage associated with the load current Io for the load is supplied to the non-inverting input "+" terminal of the operational amplifier 13.

Figure 4A:
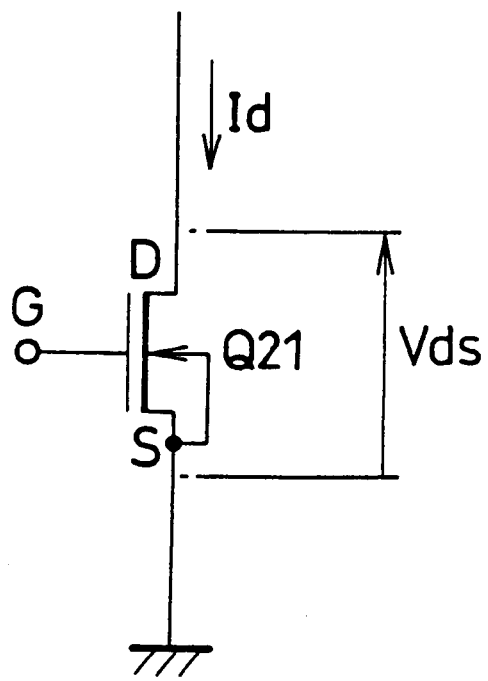
FIG. 4 is a graph useful in understanding the operation according to the invention.
Figure 4B:
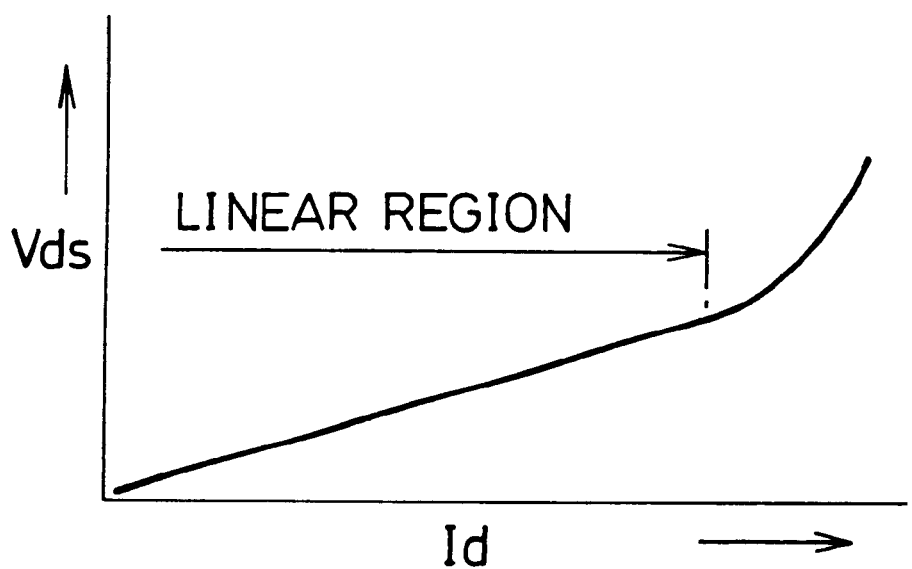

FIGS. 4(a) and (b) are useful in understanding the detection voltage Is. An exemplary load driving MOSFET Q21 shown in FIG. 4(a) is an N channel type FET in which a drain current Id is allowed to pass between the drain D and the source S of the FET, creating a drain-source voltage Vds, when an appropriate gate voltage is supplied to the gate G. FIG. 4(b) shows a typical relationship between the drain current Id and the drain-source voltage Vds. It is seen in the figure that the drain-source voltage Vds is proportional to the drain current Id over a certain domain of the drain current Id, so that the resistance of the FET is constant in the domain.

In measuring the load current Io., the invention takes advantage of this constancy of the resistance of the FET in the linear domain. Thus, as previously described in conjunction with FIG. 3, the voltage (referred to as non-inverting voltage) supplied to the non-inverting input "+" terminal of the operational amplifier 13 is proportional to the load current Io.

Denoting by Ron the resistance across the conducting load driving MOSFET QX, QY, or QZ, the non-inverting voltage is given by (Ron*Io), while the voltage (referred to as inverting voltage) which is fed to the inverting input "−" terminal, is given by (Rf*Is), where Rf is the resistance of the detection resistor 15. The amplifier 13 controls the base current of the detection transistor 14 so that the non-inverting voltage and the inverting voltage become balanced out, that is, Is=Io*(Ron/Rf).

Since the resistance Rf of the detection resistor 15 is presumably far greater than the resistance Ron of the conducting load driving MOSFETs QX–QZ, the detection current Is is far smaller than the load current Io. It will be understood that the detection current Is is still proportional to the load current Io. The detection resistor 15 is advantageously fabricated on the same semiconductor chip as the load driving MOSFETs QX–QZ, so that they have the same temperature dependent characteristics under the same ambient conditions.

In this manner, the detection current Is thus created and the reference current level Ii are compared in the control circuit 11, and if they differ, the control circuit 11 supplies appropriate gate control signals 16 to the load driving MOSFETs QU–QZ, making the difference between the currents Is and Ii vanishes, thereby attaining desired control of the loads.

Although the control can be obtained as above using the detection current Is and the reference current level Ii in the control circuit 11, a similar control can be obtained through an alternative comparison between a reference voltage Vi and the detection voltage Vo across the detection resistor Rs in the control circuit 11 by supplying the detection voltage Vo to the inverting terminal of the operational amplifier 13 as the non-inverting voltage Vo.

In the example shown above, the output level of the load is controlled by adjusting the voltage of the gate control signal 16 associated therewith. However, various alternative techniques may be used in controlling the output level of the load. For example, pulse width modulation (PWM) control may be used in which conductive period of the load driving MOSFET is controlled. Amplification control may be also used in which the level of conduction of the load driving MOSFET is regulated for the same purpose. When the conduction level of the load driving MOSFETs QU–QZ is to be controlled, its gate voltage is regulated. Accordingly, the resistance Ron of the conducting MOSFET is varied. In this case, a lookup table may be provided in the control circuit 11 so that, given a gate control voltage, an anticipated resistance Ron of the FET can be found from the table, so that a proper reference current level to be compared with the detection current Is can be obtained from the gate voltage and the resistance Ron. (so that a proper reference current level for the gate voltage can be obtained.)

Figure 5:
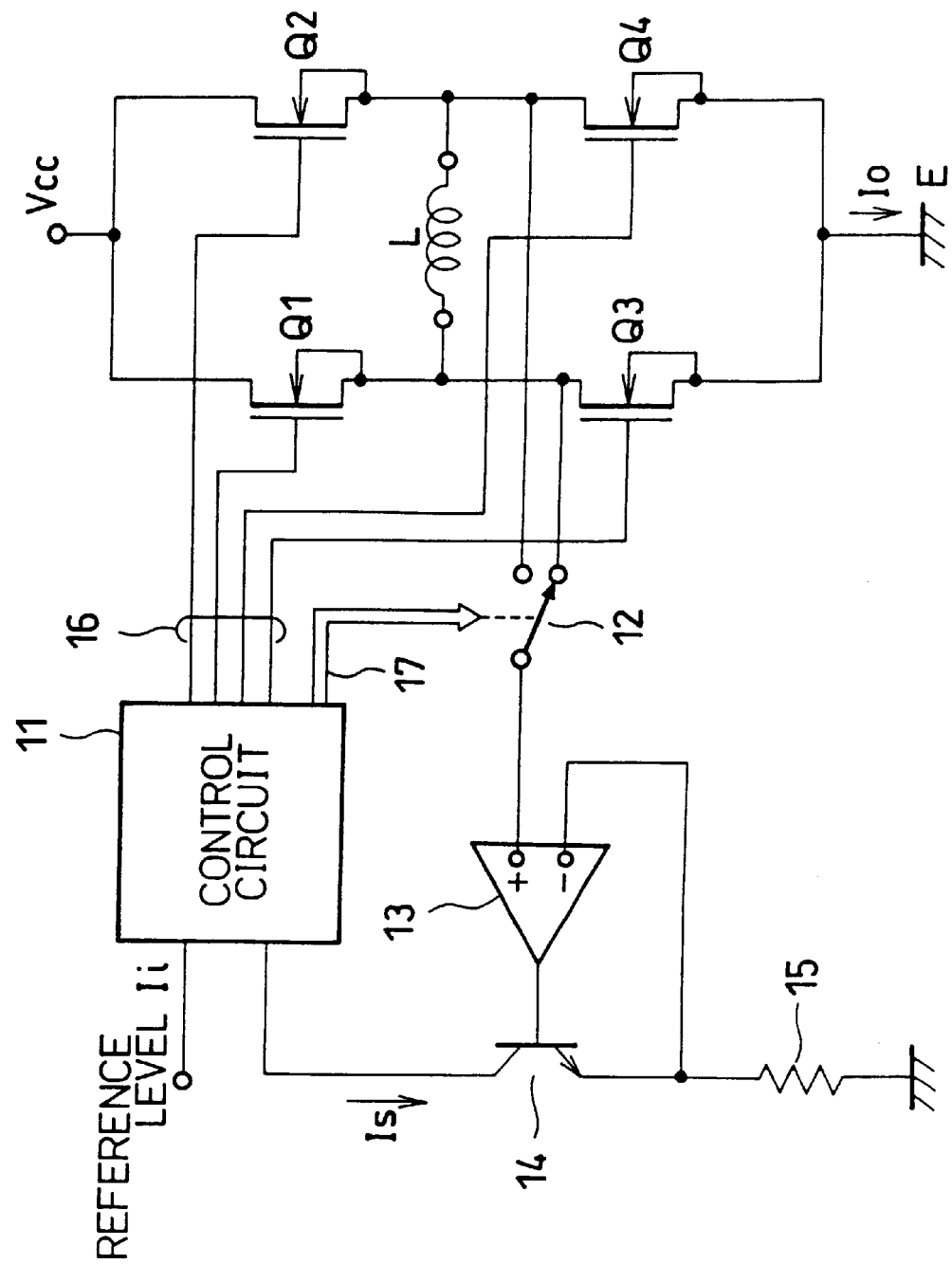
FIG. 5 is the first load driver circuit having a single bridge configuration of a load driver circuit according to the invention.

Although the invention has been applied so far to a three-phase load driver circuit as shown in FIG. 3, the invention may be equally applied to a load driver circuit having a single bridge configuration as shown in FIG. 5.

Figure 1:
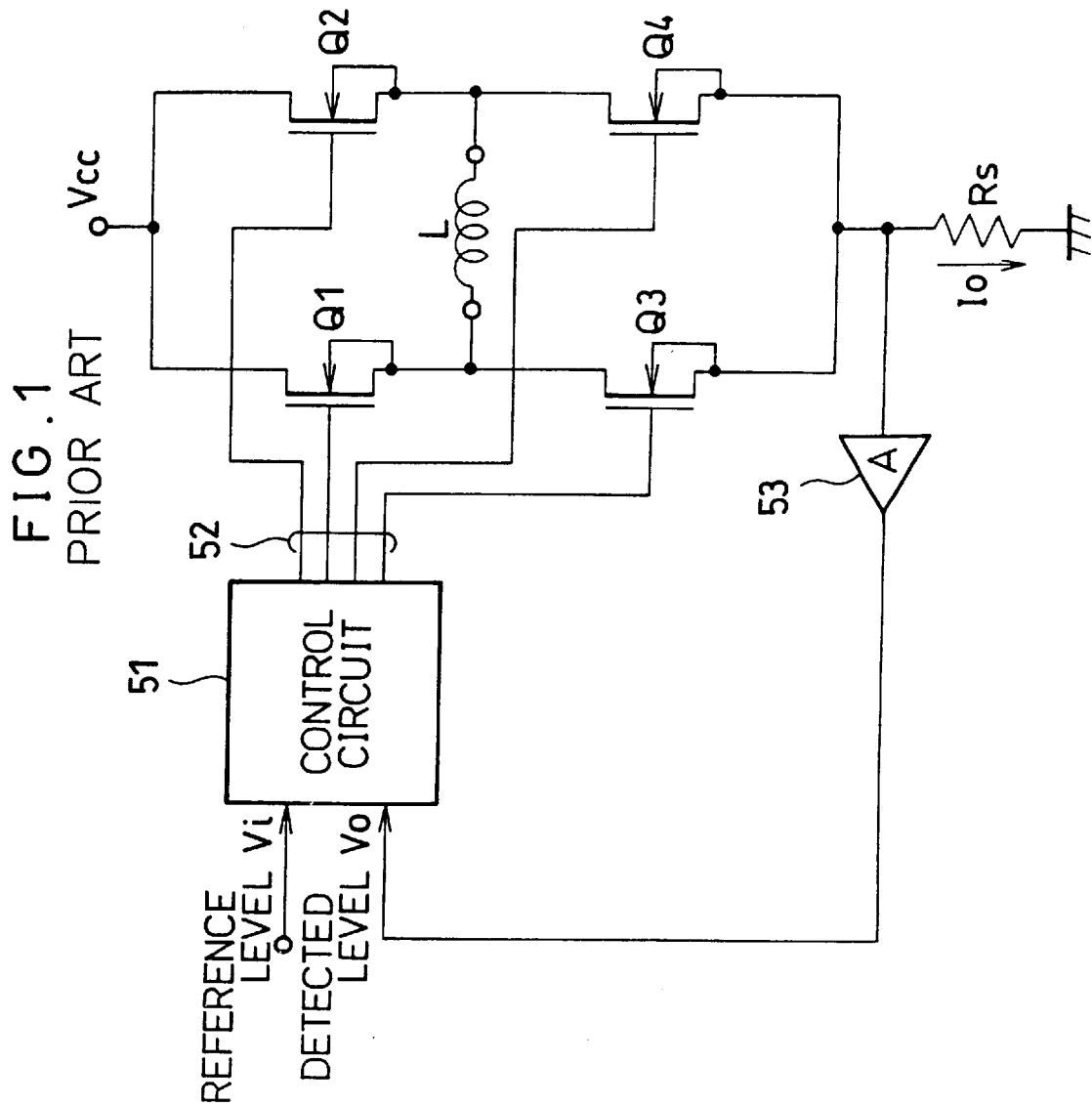
FIG. 1 shows a conventional load driver circuit.
Figure 2:
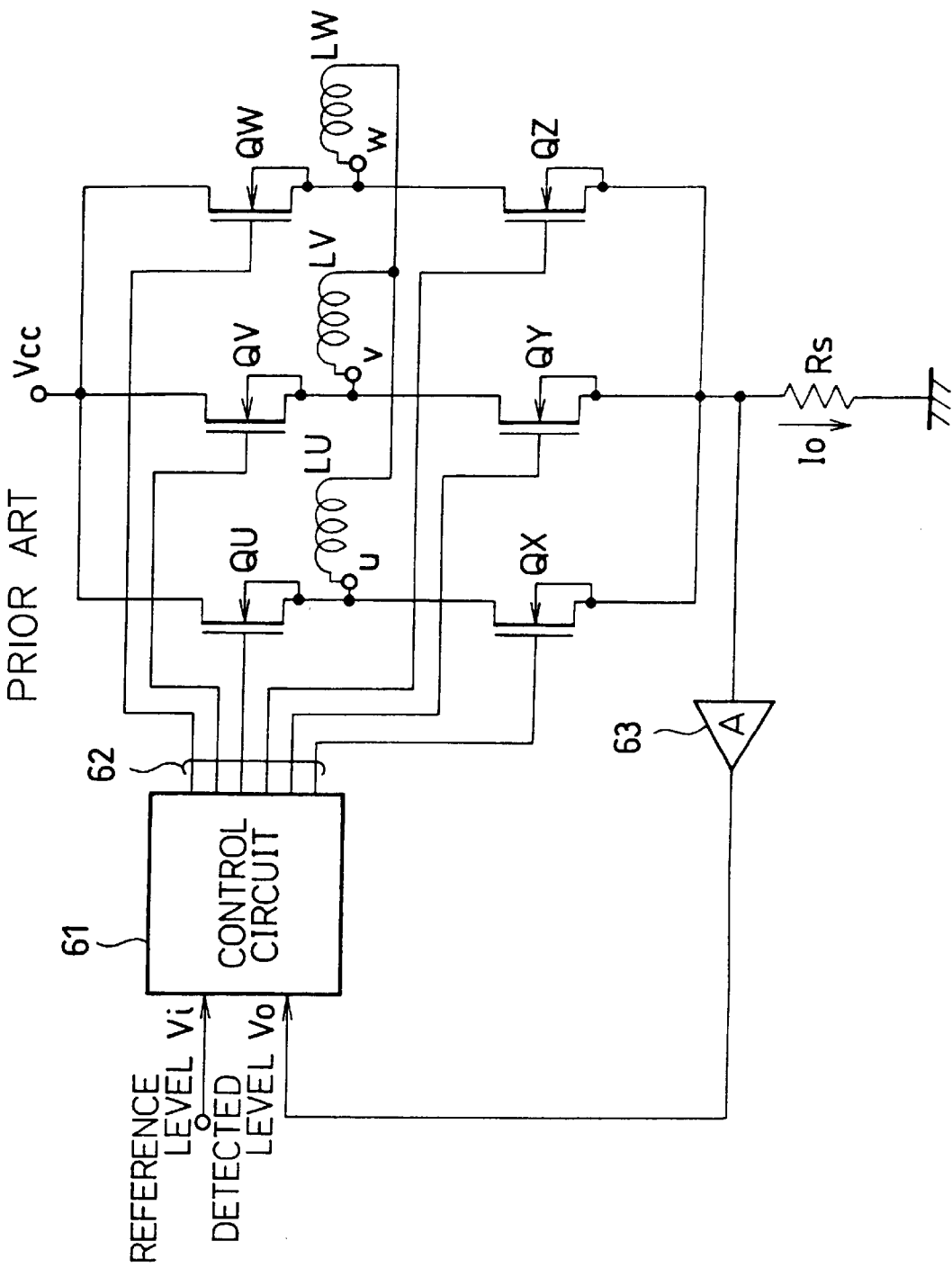
FIG. 2 shows another conventional load driver circuit.

The only difference between the two load driver circuits of FIGS. 3 and 5 is that the former circuit has a three-phase bridge configuration adapted to drive three loads in turn, while the latter circuit has a single bridge configuration for driving a single load L by four load driving MOSFETs Q1–Q4 as in conventional driver circuit shown in FIG. 1. However, the two load driver circuits have essentially the same function. Therefore, further details of the driver circuit shown in FIG. 5 will be not be repeated.

A feature of the first example of the invention shown in FIGS. 3 through FIG. 5 is that load driving MOSFETs QU–QZ (or Q1–Q4) exhibit an excellent linear dependence of the voltage drop Vds across the load and the drain current, and hence the load current Io, over a fairly wide domain, so that the MOSFETs can be regarded as constant resistors Ron for that matter, which allows precise determination of the load current Io by measuring the voltage drop Vds.

It should be appreciated that the inventive load driver circuit requires no resistor connected in series with the load driving MOSFET for determining the load current, hence eliminating any power consumption due to such resistor. Elimination of the series connected resistor also helps cut down mounting space on the semiconductor chip on one hand, and on the other hand enhance the usable range of voltage, i.e. dynamic range, of the load.

It should be also appreciated that the detection resistor 15 is formed on the same semiconductor chip as the load driving MOSFETs QX–QZ along with the operational amplifier 13 and the detection transistor 14 forming together the feedback loop, so that the detection current Is is negligibly small as compared therewith, thereby providing favorable control of the load.

Figure 6:
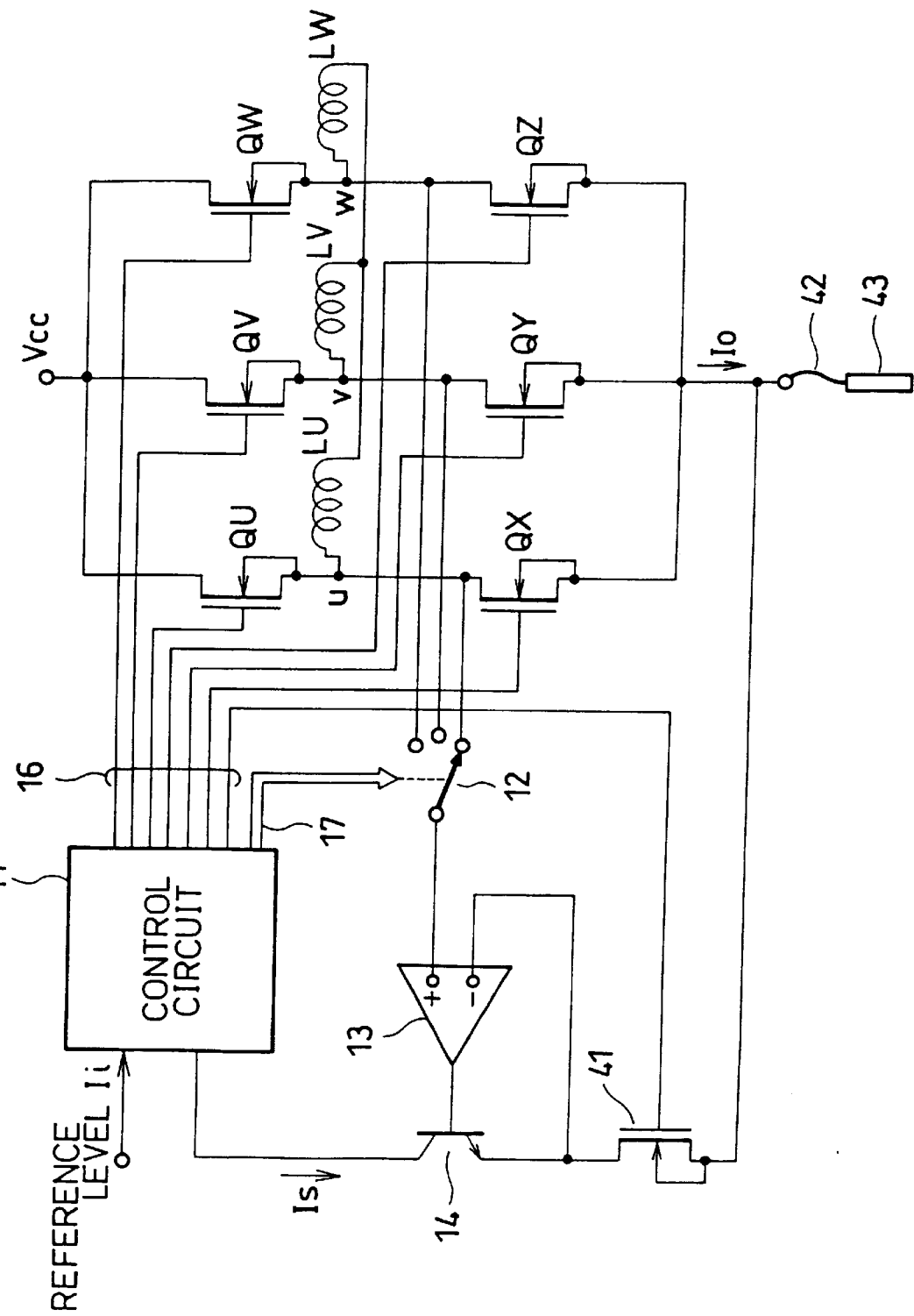
FIG. 6 is a second load driver circuit having a three-phase bridge configuration according to the invention.

Referring now to FIG. 6, there is shown a second example of the invention, which partly differs from the first example shown in FIG. 3.

The difference between the first and the second examples is that the detection resistor 15 of FIG. 3 is substituted for by a MOSFET 41 serving as a current detecting element. The current detection MOSFET 41 corresponds to the detection resistor 15 of FIG. 3 in that the MOSFET 41 serves as a constant resistor under a predetermined gate voltage received from the control circuit 11. In the example shown herein, the current detection MOSFET 41 is also fabricated on the same semiconductor chip as the load driving MOSFETs QX–QZ.

Also formed on the same semiconductor chip is a wire 42 for connecting the load driver circuit to an external terminal 43.

The rest of the components shown in FIG. 6 are the same as in FIG. 3, so that details of these components will not be repeated here.

It would be understood that the inventive concept of the second example shown in FIG. 6 may be applied to a bridge type load driving circuit as shown in FIG. 5.

In this example, the operational amplifier 13 is provided at the non-inverting input "+" terminal thereof with a voltage which equals the product (Io*Ron), where Io is the current passing through the conducting load driving MOSFETs QX–QZ and Ron is the resistance of the conducting MOSFET. A voltage (Is*Rfq) is then generated across the current detection MOSFET 41 in association with the detection current Is passing therethrough, where Rfq is the internal resistance of the conducting MOSFET 41. This voltage is supplied to the inverting input "–" terminal of the operational amplifier 13. As in FIG. 3, the detection current Is is given by the formula Is=Io*(Ron/Rfq), so that Is is proportional to Io, but far smaller than Io, since Rfq is far greater than the resistance Ron of the conducting load driving MOSFETs QX–QZ.

The current detection MOSFET 41 is fabricated on the same semiconductor chip as the load driving MOSFETs QX–QZ, and hence they have similar characteristics. Therefore, given the same gate control signal 16 from the control circuit 11 as for the load driving MOSFETs QX–QZ, the internal resistance Rfq of the MOSFET 41 is always proportional to the resistance Ron of the conducting load driving MOSFETs QX–QZ, so that the ratio Ron/Rfq always remains constant, since they have the same temperature dependent characteristics.

This also means that the current detection MOSFET 41 is little affected by manufacturing conditions which can influences the values of the resistance Ron of the load driving MOSFETs QX–QZ since the current detection MOSFET 41 and the load driving MOSFETs QX–QZ are affected by the same manufacturing conditions. Thus, the load current Io can be accurately determined from the detected current Is.

It is noted that, in this example also, an external current detection resistor and a connecting wire 42 therefor are not required either, because all the necessary circuit elements of the invention including load driving MOSFETs QX–QZ and the current detection MOSFET 41 are fabricated on the same semiconductor chip. This is favorable in eliminating possible errors caused by such wire in the determination of the detection resistance.

I claim:

1. A load driver circuit comprising:
   at least one load driving MOSFET;
   means for detecting the level of a load current including:
      a detection transistor;
      a detection resistor connected in series with said detection transistor for detecting a voltage drop across said detection resistor; and
      a difference amplifier for controlling said detection transistor, said difference amplifier fed at one input end thereof with a voltage drop across the drain and the source of said load driving MOSFET in conduction, and at the other input end thereof with said voltage drop across said detection resistor; and
   control means for receiving a signal associated with said voltage drop across the drain and the source of said load driving MOSFET along with a reference value indicative of a target level for said signal, and generating a gate control signal to said load driving MOSFET to thereby equilibrate said level of said signal with said reference value.

2. The load driver circuit as set forth in claim 1 comprising a multiplicity of load driving MOSFETs, wherein said load driving MOSFETs are formed in a bridge configuration so that said load driving MOSFETs are selectively turned on at different phases by a switching means to provide their drain-source voltage drops to said difference amplifier in the respective phases.

3. A load driver circuit comprising:
   at least one load driving MOSFET;
   means for detecting the level of a load current including:
      a detection transistor;
      a detection MOSFET serving as a detection resistor connected in series with said detection transistor for detecting a voltage drop across said detection MOSFET; and
      a difference amplifier for controlling said detection transistor, said difference amplifier fed at one input end thereof with a voltage drop across the drain and the source of said load driving MOSFET in conduction, and at the other input end thereof with said voltage drop across said detection MOSFET; and control means for receiving a signal associated with said voltage drop across the drain and the source of said load driving MOSFET along with a reference value indicative of a target level for said signal, and generating a gate control signal to said load driving MOSFET to thereby equilibrate said level of said signal with said reference value.

4. The load driver circuit as set forth in claim 3 comprising a multiplicity of load driving MOSFETs, wherein said load driving MOSFETs are formed in a bridge configuration so that said load driving MOSFETs are selectively turned on at different phases by a switching means to provide their drain-source voltage drops to said difference amplifier in the respective phases.

5. A load driver circuit comprising:
   at least one load driving MOSFET;
   a detection MOSFET serving as a detector resistor;
   means for detecting the level of a load current, wherein said detecting means is operated to:
      sense a voltage drop across the drain and the source of said load driving MOSFET;
      sense a voltage drop across the drain and the source of said detection MOSFET; and
      control a current passing through the detection MOSFET so that said voltage drop across the drain and the source of said detection MOSFET equals said voltage drop across the drain and the source of said load driving MOSFET; and
   control means for receiving a signal associated with said voltage drop across the drain and the source of said load driving MOSFET along with a reference value indicative of a target level for said signal, and generating a gate control signal to said load driving MOSFET to thereby equilibrate said level of said signal with said reference value.

6. A load driver circuit comprising:
   at least one load driving MOSFET;
   a detector operates to detect the level of a load current, said detector including:
      a detection transistor;
      a detection MOSFET serving as a detection resistor connected in series with said detection transistor for detecting a voltage drop across said detection MOSFET; and
      a difference amplifier for controlling said detection transistor, said difference amplifier fed at one input end thereof with a voltage drop across the drain and the source of said load driving MOSFET in conduction, and at the other input end thereof with said voltage drop across said detection MOSFET; and
   a controller operates to receive a signal associated with said voltage drop across the drain and the source of said load driving MOSFET along with a reference value indicative of a target level for said signal, and generate a gate control signal for said load driving MOSFET to thereby equilibrate said level of said signal with said reference value.

7. The load driver circuit as set forth in claim 6 comprising a multiplicity of load driving MOSFETs, wherein said load driving MOSFETs are formed in a bridge configuration so that said load driving MOSFETs are selectively turned on at different phases by a switch to provide their drain-source voltage drops to said difference amplifier in the respective phases.

8. A load driver circuit comprising:
   at least one load driving MOSFET;
   a detection MOSFET serving as a detector resistor;
   a detector operates to detect the level of a load current, said detector including:
      a first voltage sensor operates to sense a voltage drop across the drain and the source of said load driving MOSFET;
      a second voltage sensor operates to sense a voltage drop across the drain and the source of said detection MOSFET; and
      a current controller operates to control a current passing through the detection MOSFET so that said voltage drop across the drain and the source of said detection MOSFET equals said voltage drop across the drain and the source of said load driving MOSFET; and
   a signal controller operates to receive a signal associated with said voltage drop across the drain and the source of said load driving MOSFET along with a reference value indicative of a target level for said signal, and generate a gate control signal for said load driving MOSFET to thereby equilibrate said level of said signal with said reference value.

* * * * *